United States Patent [19]

Bernards et al.

[11] Patent Number: 5,395,652
[45] Date of Patent: Mar. 7, 1995

[54] PLATING CATALYST FORMED FROM NOBLE METAL IONS AND BROMIDE IONS

[75] Inventors: Roger F. Bernards, Natick; Gordon L. Fisher, Sudbury; Wade W. Sonnenberg, Upton, all of Mass.

[73] Assignee: Shipley Company Inc., Marlborough, Mass.

[21] Appl. No.: 177,593

[22] Filed: Jan. 5, 1994

[51] Int. Cl.[6] ............................................... B05D 3/10
[52] U.S. Cl. ................... 427/304; 427/305; 427/306; 427/443.1; 106/1.11
[58] Field of Search ............ 427/304, 305, 306, 443.1; 106/1.11

[56] References Cited

U.S. PATENT DOCUMENTS 3,011,920  12/1961  Shipley .
4,180,480  12/1979  Jameson et al. .................. 106/1.11
5,153,024  10/1992  Schutyser ........................ 427/97

FOREIGN PATENT DOCUMENTS 0510711  4/1991  European Pat. Off. .

Primary Examiner—Shrive Beck
Assistant Examiner—Katherine A. Bareford
Attorney, Agent, or Firm—Robert L. Goldberg

[57] ABSTRACT

A process and catalyst for electroless plating of metal over a substrate. The process involves providing a catalyst that is the product of reaction of a noble metal with bromide ions where the ratio of bromide ions to noble metal ions is at least 100 to 1 and the noble metal is present in a concentration sufficient to catalyze an electroless plating reaction, contacting a substrate to be plated with the catalyst, and reducing the catalyst prior to or during plating of the substrate.

20 Claims, 5 Drawing Sheets

PLATING CATALYST FORMED FROM NOBLE METAL IONS AND BROMIDE IONS

BACKGROUND OF THE INVENTION

1. Introduction

This invention relates to catalysts for electroless metal deposition. More particularly, this invention relates to a catalytic process especially useful for catalyzing substrates having a metal such as copper over at least a portion of its surface and catalyst materials useful in said process. The catalysts of the invention are useful for multilayer circuit fabrication and for the manufacture of other industrial products.

2. Description of the Prior Art

Electroless metal deposition is the deposition of metal over a substrate in the absence of an external electric current. The procedure is especially useful for metal plating substrates where at least a portion of the substrate is of a dielectric material. Electroless metal deposition processes and catalytic materials are known in the art and described in numerous publications.

An early patent disclosing an electroless plating catalyst used in large volume is U.S. Pat. No. 3,011,920, incorporated herein by reference. In accordance with this patent, an electroless plating catalyst is formed by reduction of palladium ions with stannous ions to form a tin-palladium colloid. A substrate is plated by a step of immersion of the substrate in the colloidal catalyst whereby colloidal particles absorb on the surface of the substrate. The substrate is then subjected to a step of acceleration and metal plated by immersion of the substrate in a metal plating solution that contains dissolved metal ions of a metal to be plated. Contact of the metal ions with the colloidal palladium catalyst in the presence of a reducing agent results in the electroless metal deposition of the metal over the substrate. An improved catalytic process is disclosed in published European Patent Application, Publication No. 0 510 711, incorporated herein by reference. In accordance with preferred procedures of this application, a process for metallization comprises the steps of formation of a ligating layer over a substrate having terminus groups capable of bonding with a catalyst precursor. Preferably, the terminus groups comprise a metal ion binding or ligating group, and the layer is a self-assembled film having terminus ligating groups. Following formation of the ligating layer, the layer is contacted with a catalyst precursor solution such as a solution believed to be a palladium-chloro complex. The complex bonds with the ligating groups of the ligating layer. Subsequent contact of the layer with an electroless metal plating catalyst containing a suitable reducing agent results in selective electroless metal deposition of metal onto the ligating layer.

A disadvantage to the above process involves contact of the chloro complex with a substrate having a metallic portion such as a printed circuit board substrate. In practice, it has been found that contact of the metallic portion of the substrate with the chloro complex results in formation of a displacement coating over the metallic portion of the surface. The displacement coating is poorly adherent to the underlying metal and therefore, subsequently applied electroless metal over the displacement coating is poorly bonded to the underlying metal surface and has a tendency to flake off during use. In addition to the formation of a displacement coating, the chloro complex used in the process of the EPO application has a short shelf life. In practice, it has been found that upon standing for short periods of time, e.g., 24 hours, the complex converts to an unstable colloid, probably by chain-length extension, and the so formed unstable colloid is unsuitable for use as an electroless plating catalyst.

SUMMARY OF THE INVENTION

The present invention provides a new catalytic procedure for electroless metal plating using the product resulting from the admixture of a source of bromide ions and a noble metal rather than the chloro complex of a noble metal of the prior art. The product of the admixture of the source of bromide ions with the noble metal is believed to be a complex but the structure is not completely understood. For purposes of the disclosure herein, the product resulting from the admixture will be referred to as a bromo complex of the noble metal.

It has been discovered that as with the chloro complex, the bromo complex adsorbs onto a surface and is capable of reduction to a catalytic layer for electroless metal deposition when contacted with a suitable reducing agent. However, it has also been unexpectedly found that with a sufficient molar excess of the bromide ion relative to noble metal, the bromo complex does not displace metal surfaces to be plated thereby avoiding the formation of a displacement coating over metallic surfaces. It has also been unexpectedly found that the bromo complex is substantially more stable during standing than its chloro complex counterpart. Finally, it has been found that increases in the ratio of bromide ion to the noble metal does not adversely effect catalytic activity whereas catalytic activity of the chloro complex decreases as the ratio of chloride ion to noble metal increases.

The catalysts of the invention are especially suitable for use with the ligating layer of the above-referenced EPO Application No. 0 510 711 but are not limited to use therewith. However, it is a further discovery of this invention that the bromo complex absorbs onto the surface of a suitably prepared dielectric with sufficient bond strength whereby the complex can be used alone without the need to use a ligating layer over the substrate.

The catalytic material of the invention may be used for a wide variety of purposes but is especially useful for the formation of multilayer circuit boards using additive plating techniques.

DESCRIPTION OF THE PREFERRED EMBODIMENTS

Figure 1:
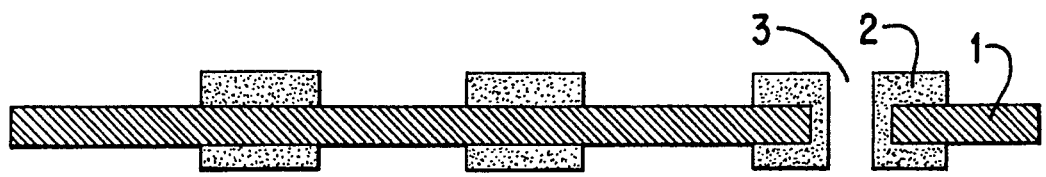
FIGS. 1, 2, 3, 4, 5, 6, 7, 8, 9, 10 and 11 illustrate the formation of a multilayer circuit board in accordance with one embodiment of the invention.

Tin chloro-noble metal complexes have been studied and reported in the literature as an intermediate in the formation of a tin-noble metal colloid for electroless plating procedures. Such ligands are disclosed, for example, by Kattak et al., "Chemical Communications", Nov. 17, 1965, p. 400; Batley et al., "Inorg. Nucl. Chem. Letters", Vol. 4, pp. 577-580, 1968; Young et al., "Complexes of Ruthenium, Rhodium, Iridium, and Platinum With Tin(2)", *Journal of the Chemical Society*, No. 922 (1964), pp. 1576-1589; and Deminjer et al., "The Nucleation With SnCl₂—PdCl₂ Solutions of Glass Before Electroless Plating", *J. Electrochem. Soc.: Electrochemical Science and Technology*, December 1973, pp. 1644-1650. In several of the aforesaid publications, it is reported that the presence of the tin in the ligand results in in situ reduction of the noble metal to a reduced colloidal particle.

Similar ligands of chlorine and a noble metal are formed in compositions free of tin. Halo complexes are reported by Sidgwick, *Chemical Elements and Their Compounds*, Volume II, The Claredon Press, 1962. The platinum family of metal halides is described in Chapters VIII A through C, for example, palladium bromide and chloride are reported on page 1560 and platinum bromide and chloride on page 1582. These ligands are more stable than their counterparts containing tin since they do not undergo in situ reduction due to the presence of a reducing agent within the complex structure. The bromo complexes of noble metals are discussed in the literature to a much lesser extent than the closely related chloro complexes. It is believed that they may be represented by the following general structure where the hydroxyl ions and bromide ions are randomly distributed in each repeating unit:

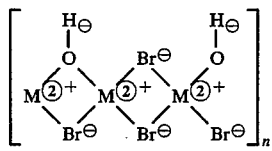

where M is a noble metal other than mercury such as gold, silver, palladium, platinum, ruthenium, iridium, etc. It is further believed that the hydroxides are replaced by bromides as the bromine to noble metal ratio increases. It is also possible that the catalytic material may be in the form of a colloidal dispersion.

In accordance with the invention disclosed herein, bromo complexes of a noble metal, preferably palladium, are used as catalyst precursors in an electroless metal deposition procedure. Noble metal bromides are typically insoluble in aqueous solution and have to be formed using soluble salts. The complexes are readily formed by dissolving soluble salts of bromine and the noble metal in water at a temperature varying between room temperature and about 200° F. with stirring. Low temperatures are preferred and room temperature is suitable. The complex readily forms upon standing, typically within a few minutes.

In the above procedure, the concentration of the noble metal may be reduced by addition of a second metal salt that is catalytic to electroless metal deposition but is not a noble metal. Suitable catalytic metals that may be used include copper and nickel with copper being preferred. It has been found that the noble metal content may be reduced by as much as 90 percent if replaced by a non-noble metal in a ratio of at least about 5 parts non-noble metal for each part of noble metal replaced and preferably in a ratio of 10 parts non-noble metal for each part of noble metal replaced.

Any aqueous soluble salts of the noble metal, non-noble metal, and bromine may be used to form the complex. Typical examples of noble metal salts include platinic acid, platinum chloride, sodium tetrachloropallidate, palladium sulfate, palladium sulfate, palladium nitrate, gold chloride, silver nitrate, etc. Soluble salts of palladium are preferred and palladium sulfate is most preferred. Suitable salts of bromine include ammonium bromide, cadmium bromide, potassium bromide, sodium bromide, etc. The alkali metal bromides are preferred. Suitable salts of the non-noble metal, when used, include copper sulphate, copper chloride, copper acetate, nickel sulphate, etc.

To prepare the bromo complex of the noble metal in accordance with the invention, the amount of noble metal used to formulate the complex must be sufficient to provide adequate catalysis of a part to be plated, but for economic reasons is desirably low. A preferred range for the noble metal used to form the complex is from about 0.00005 moles per liter of solution to that concentration whereby a precipitate forms, more preferably between about 0.0001 and 0.25 moles per liter and most preferably, in an amount of from 0.0002 to 0.01 moles per liter. The amount of the noble metal may be reduced to a lower concentrations when a non-noble catalytic metal is used in amounts as discussed above. The ratio of bromine to noble metal is important to performance of the complex as a catalyst precursor for electroless metal plating. In this respect, it has been found that to avoid formation of a displacement coating over a metal substrate during the step of contact with the complex, the bromide must be substantially in excess of the stoichiometric amount required to form the complex with the noble metal. Moreover, higher ratios increase stability of the catalytic material without adversely effecting catalytic activity. Accordingly, the molar ratio of bromine to noble metal in accordance with the invention is at least 100 to 1, preferably at least 250 to 1, and more preferably within a range of from 400 to 1 to 1,000 to 1.

The complex catalyst precursor of the invention is an improvement over palladio-chloride complexes of the prior art and it is used in an analogous manner to catalyze a substrate for plating. Most simply stated, a part prepared for plating in conventional manner is immersed in a solution of the complex for a period of time sufficient to effect absorption of the complex onto the substrate, typically a period ranging from several seconds to about 10 minutes dependent upon the surface preparation of the part. Following immersion in the solution of the complex, the part is removed and rinsed and immersed in a solution of a reducing agent of sufficient strength to reduce the noble metal to a reduced catalytic form. Suitable reducing agents include alkali metal hypophosphites, formaldehyde, alkali metal borohydrides, and amine boranes. Of these reducing agents, the borohydrides and amine boranes are preferred. The reducing agent is desirably contained in solution in an amount of from about 1 to 10% by weight and for the amine boranes, the solution is preferably alkaline having a pH ranging from about 7.5 to 12 and preferably between 8 and 11. Sodium or potassium hydroxide may be used to provide the desired alkalinity.

The reducing agent may be a component of a metal plating solution in which case a separate step of treatment with a reducing agent may not be required. All electroless plating solutions contain a reducing agent and many of these solutions are capable of reducing the complex without a separate step of reduction. For example, when a nickel plating solution containing an amine borane as a reducing agent is used, a separate step of reduction of the bromo complex is not typically required. Even a copper plating solution containing formaldehyde as the reducing agent may reduce the bromo complex if the solution contains a low concentration of stabilizing agent. The determination of the ability of a plating solution to reduce the bromo complex may be determined by routine experimentation.

A process for catalyzing a surface using a palladium chloride complex is shown in Examples 1 and 2 of U.S. Pat. No. 5,153,024, incorporated herein by reference. The process disclosed therein is suitable for use with the complex of the subject invention where the complex of the invention would be substituted for the palladium chloride complex disclosed in the patent.

In a preferred embodiment of the invention, the complex is used in a process of the type disclosed in the above-referenced EPO Application, Publication No. 0 510 711. In accordance with the process of the EPO application, a substrate such as an electronic substrate—i.e., a circuit board substrate or a wafer—is prepared by oxidation to render the same hydrophilic through the formation of hydroxyl groups on the substrate surface. Oxidation can be accomplished using plasma etching, permanganate or corona discharge, all in accordance with known prior art procedures. Of the preparation methods available, use of a standard permanganate etching solution is preferred.

Following formation of a hydrophilic surface, the surface is treated with a composition capable of forming a self-assembling film that bonds to the hydrophilic substrate and has terminus groups on its surface remote from the substrate. The so-formed film is then contacted with the complex catalyst precursor which ligates with the terminus groups of the coating to bind the catalyst precursor to the substrate through the self-assembled layer. The substrate is then plated, preferably first by contact with a solution of a reducing agent and then by contact with an electroless metal plating solution. A modification of the process of the EPO Application is disclosed in the above cited copending application where, prior to contact with the catalyst precursor solution, an organic relief layer is formed over the self-assembled film layer. The organic relief layer defines a pattern of a coating having recesses in open communication with the self-assembled film layer. The part is then contacted with the solution of the complex catalyst precursor which ligates with the self-assembled film layer but does not adhere to the organic relief coating since the relief coating does not have groups with which the complex can ligate, thus forming a catalytic precursor coating over the substrate in a desired pattern. Thereafter, the substrate is metal coated by contact first with a reducing agent and then with an electroless metal plating solution or by contact with a metal plating solution containing a strong reducing agent to reduce the complex while simultaneously depositing metal over the catalyzed surface.

The complex catalyst precursor of the invention is also suitable for catalyzing a dielectric surface without the requirement of the ligating layer provided that the dielectric surface has been properly prepared. Again, the preparation of the substrate comprises formation of a hydrophilic surface by oxidation in a manner described above, preferably using a conventional permanganate solution. The oxidation of the dielectric substrate results in formation of a hydrophilic surface to which the bromo complex readily adsorbs.

The invention will be better understood by reference to the drawings which illustrate a process for fabrication of a multilayered circuit board using the bromo complex of the invention.

Figure 2:
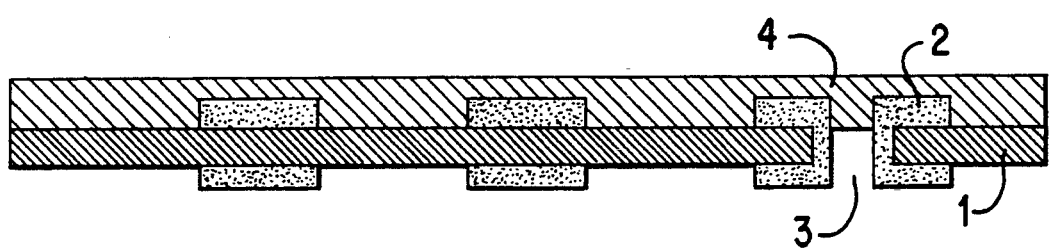

With reference to FIG. 1 of the drawings, there is shown a circuit board substrate having an electroless metal deposit 2 defining conductor lines and a plated through-hole 3 connecting one side of the board to the other side of the board. In FIG. 2 of the drawings, the circuit board of FIG. 1 has been coated with a permanent photoimageable dielectric coating 4 which both fills the spaces between conductor lines 2 and provides a smooth layer above the tops of the conductor lines.

Figure 3:
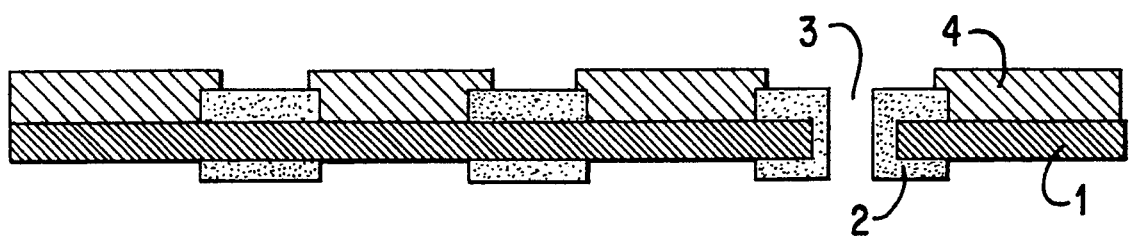
Figure 4:
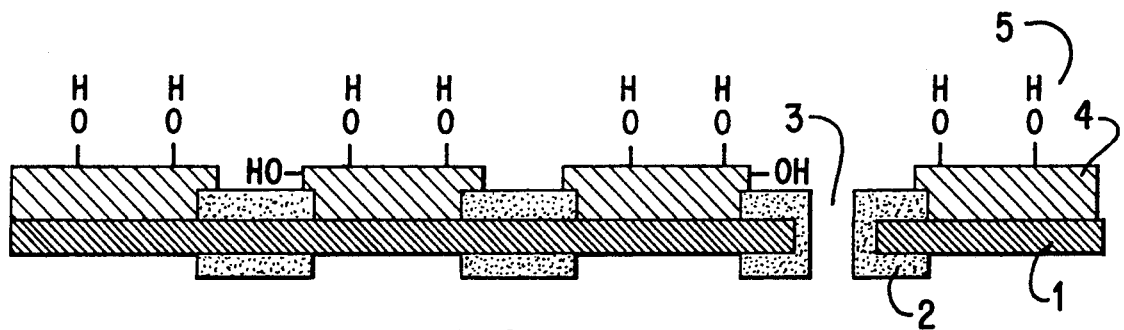
Figure 5:
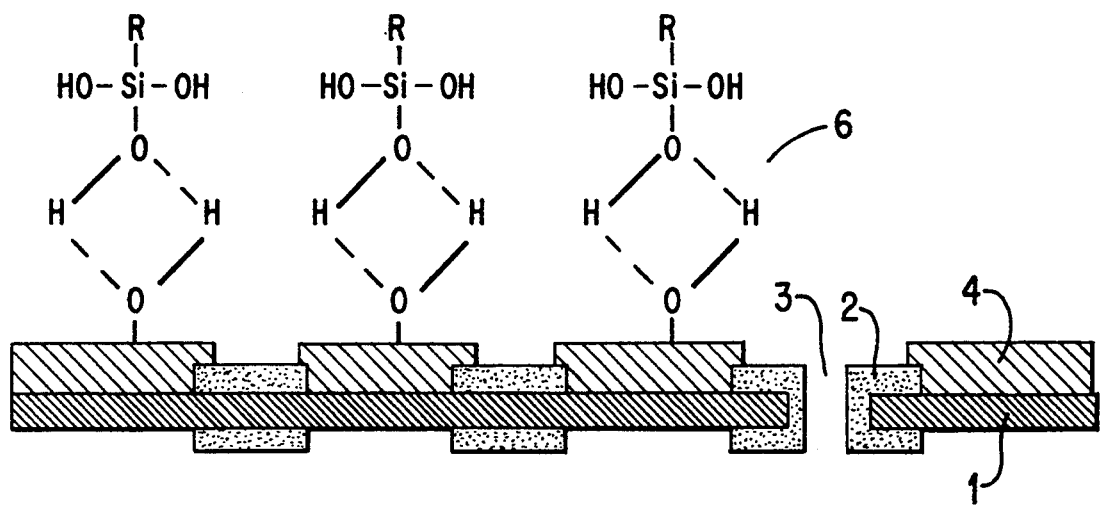

In FIG. 3 of the drawings, it is shown that following formation of dielectric layer 4, the dielectric layer has been imaged by exposure to activating radiation and developed with a suitable developer to form a relief image defining recesses within the coating in open communication with conductors 2. The next step in the process comprises oxidizing the dielectric coating 4 by contacting the same with an oxidizing agent to hydrolyze the surface of coating 4 to form hydroxyl groups 5 thereon. Thereafter, the surface is contacted with a ligating layer 6 as shown in FIG. 5 (in exaggerated dimension) whereby the ligating layer bonds to the hydroxyl groups by hydrogen bonding. It can be seen that selectivity for subsequent selective metallization is achieved by absorption of the ligating layer only on dielectric layer 4, but not on the surfaces of conductors 2. Drying or baking the ligating layer results in the elimination of a molecule of water from ligating material 5 with the formation of the ligating layer bonded to the dielectric layer through oxygen silicone covalent bond 7 as shown in FIG. 6.

Figure 6:
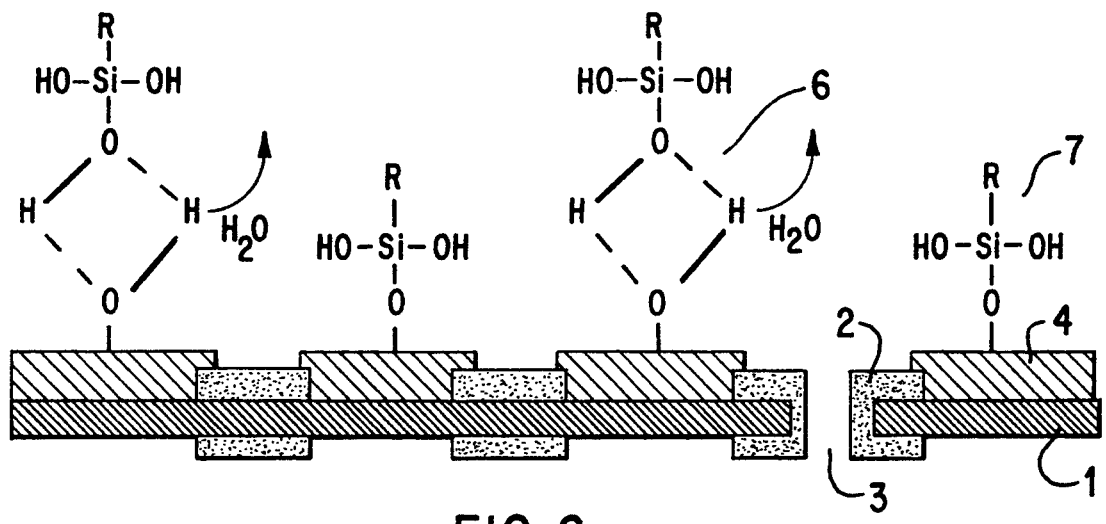
Figure 7:
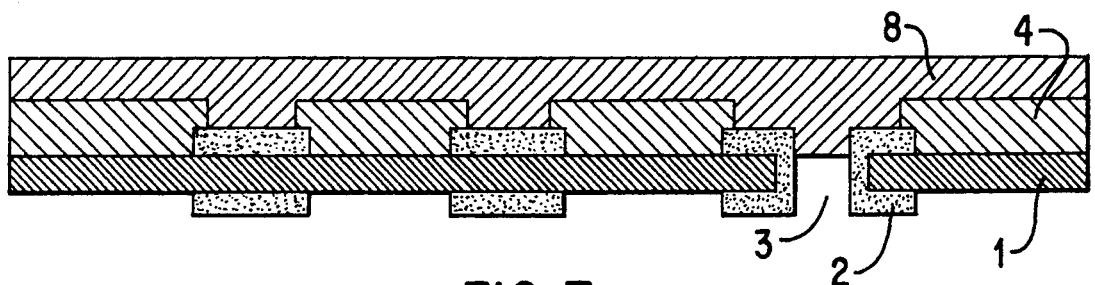
Figure 8:
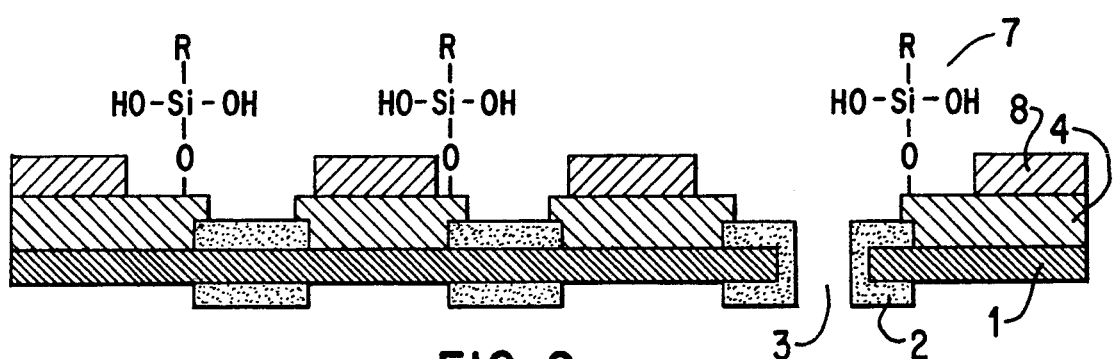

The next step in the process, illustrated in FIG. 7, comprises coating the article formed in FIG. 6 with an additional permanent, photoimageable, dielectric layer 8. The ligating layer 7 shown in FIG. 6 is located only at the interface between dielectric layers 4 and 8. As shown in FIG. 8, the dielectric layer 8 has been exposed to activating radiation and developed to bare ligating layer 7 on the surface of dielectric layer 4. It should be noted that additional ligating layer 7 is present between dielectric layers 4 and 8 but is prevented from participating in reactions to be described below because it is covered by dielectric layer 8.

Figure 9:
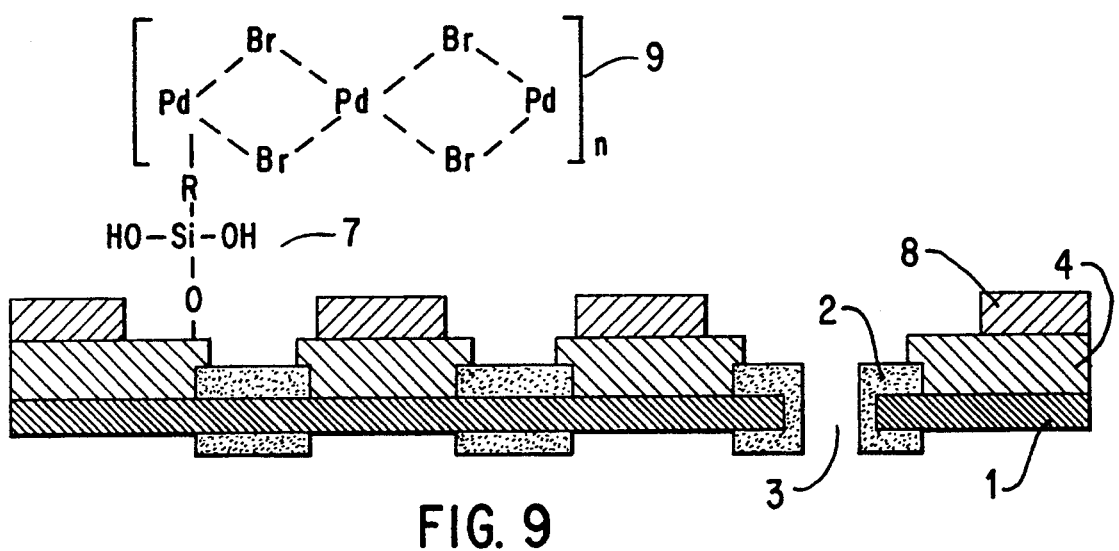
Figure 10:
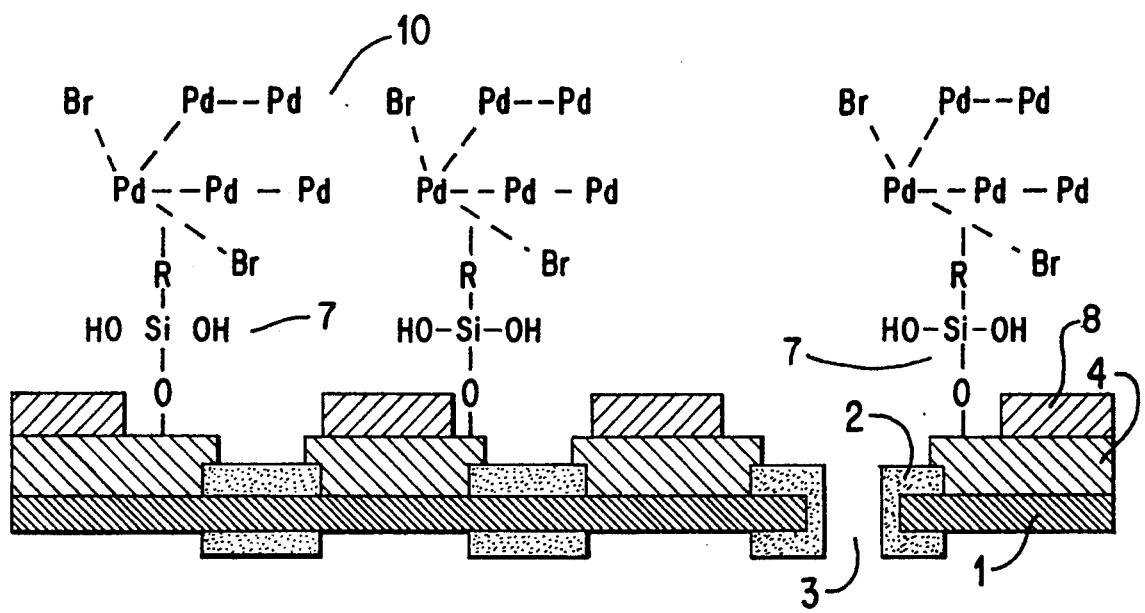

In FIG. 9, the next step in the process is illustrated and comprises contact of the ligating layer with the bromo complex of the invention. Where the ligating layer has a terminus group capable of bonding with the bromo complex, the bromo complex absorbs over the ligating layer and bonds thereto. Following coupling of the bromo complex 9 with the ligating layer 7, the substrate is immersed in a solution of a reducing agent to reduce ionic noble metal (shown as palladium) in the complex to metallic palladium which is in the form of cluster 10 as shown in FIG. 10. The reduced palladium 10 is catalytic to electroless metal deposition.

Figure 11:
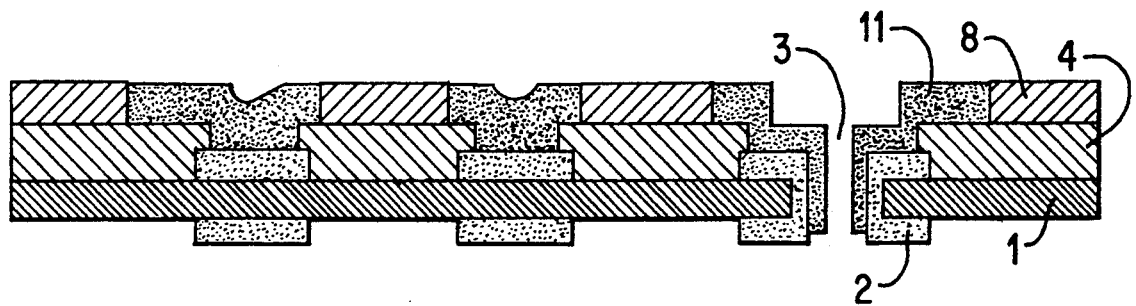

The next step in the process comprises depositing electroless metal 11 over catalytic material 10 as illustrated in FIG. 11 of the drawings. In FIG. 11, it can be seen that the metal deposit 11 forms only over dielectric layer 4 where there are catalytic sites, but not over dielectric layer 8. Hence, metal may be deposited selectively in accordance with the invention.

It should be obvious that the procedure can be repeated as many times as desired to form a multilayer circuit board using fully additive metal plating procedures.

It is possible to avoid the use of the ligating layer and still accomplish selected deposition in accordance with the procedures of the invention provided a substrate is suitably prepared using prior art treatment procedures as will be illustrated in the examples that follow.

EXAMPLES 1-8

In the following examples, catalysts with differing ratios of bromide ion to palladium were prepared. All catalysts were prepared by dissolving potassium bromide in 1,000 ml of DI water at room temperature. Thereafter, palladium chloride was added with stirring. The catalyst was then allowed to stand for up to several hours during which time it formed a dark red-brown color. The amounts of palladium chloride and potassium bromide used and the ratio of the two are set forth in the following table.

| Example No. | PdCl$_2$ (Grams) | KBr (Grams) | Molar Ratio (Br:Pd) |
| --- | --- | --- | --- |
| 1 | 0.20 | 30 | 223:1 |
| 2 | 0.20 | 40 | 298:1 |
| 3 | 0.15 | 30 | 298:1 |
| 4 | 0.20 | 50 | 372:1 |
| 5 | 0.15 | 40 | 397:1 |
| 6 | 0.10 | 30 | 447:1 |
| 7 | 0.15 | 50 | 495:1 |
| 8 | 0.10 | 40 | 596:1 |

Examples 7 and 8 represent most preferred embodiments of the invention.

EXAMPLES 9-16

The formulations of Examples 1 through 8 were used to plate a copper clad FR-4 circuit board substrate having through-holes using the following procedure where all formulations used to treat the parts are available from Shipley Company Inc. of Marlborough, Mass.

a. Immerse the part in CIRCUPOSIT ® Cleaner-Conditioner 3302 for 5 minutes at 160° F. to swell the surface. CIRCUPOSIT Cleaner-Conditioner 3302 is a proprietary mixture of organic solvents.

b. Immerse the part in CIRCUPOSIT Promotor 3308 for 5 minutes at 160° F. CIRCUPOSIT Promoter 3308 is a proprietary permanganate treatment solution.

c. Immerse the part in CIRCUPOSIT Neutralizer 3314 for 2 minutes at room temperature. CIRCUPOSIT Neutralizer 3314 is a proprietary peroxide sulfuric acid solution.

d. Immerse the part in the bromo-palladium complex formed in accordance with Examples 1 through 8 for 5 minutes at room temperature and observe immersion deposit formed over copper surface.

e. Immerse the part in a solution of 4 grams of dimethylamine borane having a pH of 9.

f. Immerse the part in an electroless copper plating solution identified as CIRCUPOSIT Copper 3350 for 10 minutes at 150° F.

The results obtained are set forth below.

| Example No. | % of Coverage | Immersion Deposit |
| --- | --- | --- |
| 9 | 100 | Heavy |
| 10 | 100 | Heavy |
| 11 | 100 | Moderate |
| 12 | 100 | None |
| 13 | 100 | None |
| 14 | 100 | Slight |
| 15 | 100 | None |
| 16 | 100 | None |

EXAMPLE 17

Figure 12:
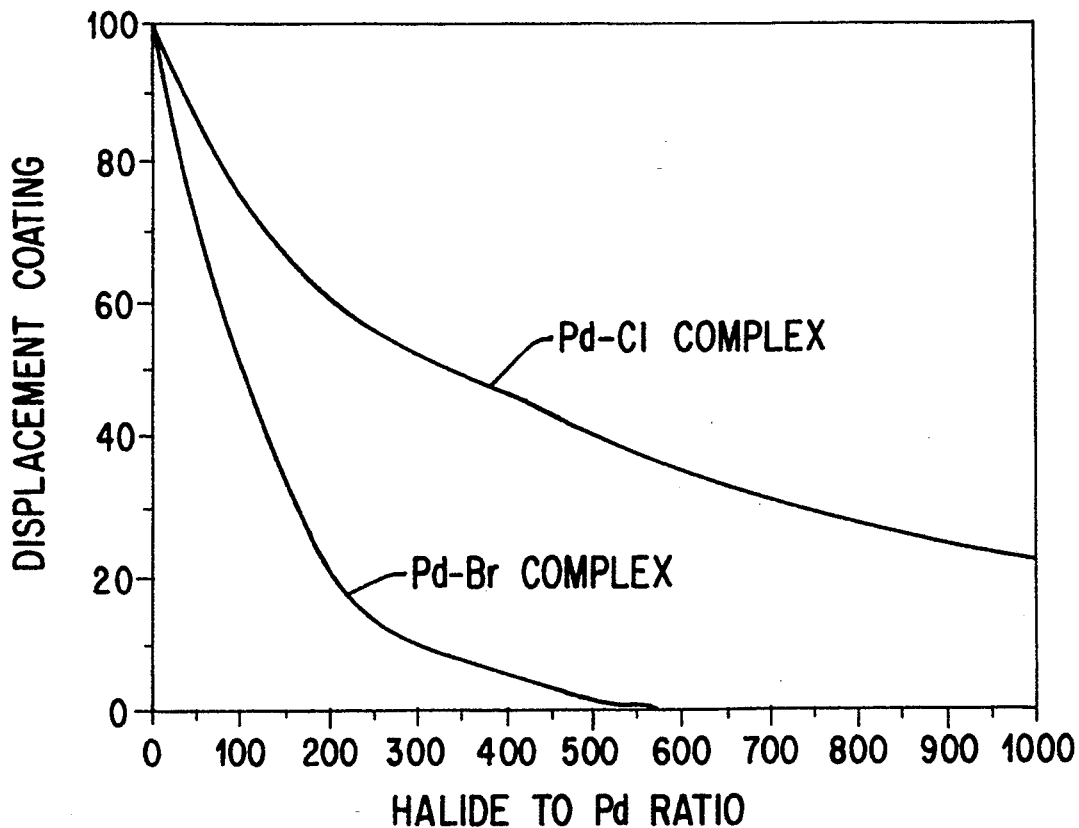
FIG. 12 graphically represents displacement coating formation over copper as a function of halide ion content.

Using the procedures of Examples 1-8, a series of catalysts were prepared by reaction of bromide ions with palladium and a second series of catalysts were prepared by reaction of chloride ions with palladium. Compositions were made with the ratio of halide ion (excluding halide ion from the palladium halide salt) varying from 0:1 to 1000:1. The solutions were contacted with a copper clad substrate and the formation of a displacement coating over the copper observed. An arbitrary scale was devised where 100 represents a heavy black "smut"-like coating formed over the copper, 0 represents essentially clean copper with no displacement coating, and the numbers between 0 and 100 represent a linear gradation between the 0 and 100 values. The results obtained are shown in FIG. 12 from which it can be seen that as the ratio of bromide ion to palladium increases, the amount of displacement coating decreases rapidly until a ratio of about 500:1 (for this example) is reached, at which point, there is essentially no displacement coating formed over the copper. In contrast, using the chloro complex, the decrease in displacement coating formation as a function of the ratio of halide ion to palladium decreases at a much reduced rate. Within the range of 0:1 to 1000:1, undesirable displacement coating is always formed with the chloro complex.

EXAMPLE 18

Figure 13:
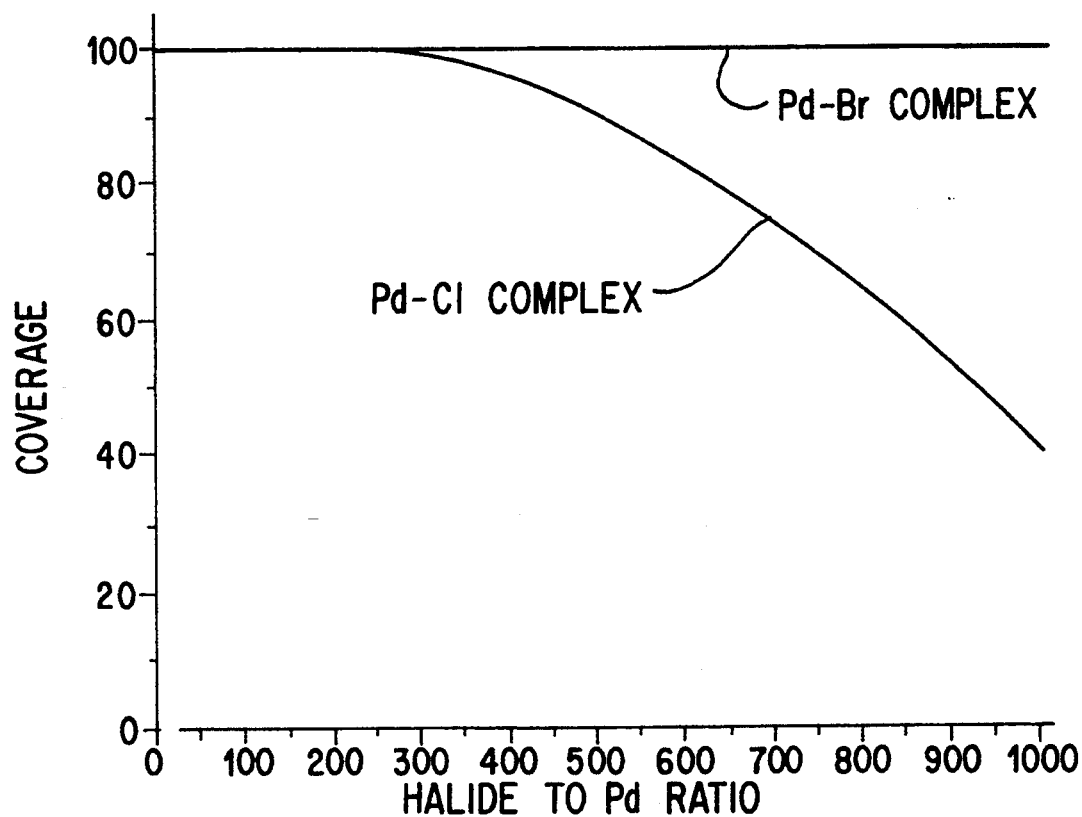
FIG. 13 graphically represents catalytic activity as a function of halide ion content.

Using the catalyst prepared in Example 17 and the plating procedures of Examples 9-16, the catalysts were evaluated for catalytic activity as a function of halide ion concentration. The results are shown in FIG. 13 where the halide ion to palladium ratio is shown as a function of percent coverage of a substrate. From the curves, it can be seen that within the ratio of 1000:1, there is no drop-off in catalytic activity for the palladium bromide complex whereas the coverage for the palladium chloride catalyst begins to drop off at a ratio between 300 and 400:1.

We claim:

1. A process for electroless plating of metal over a substrate, said process comprising the steps of providing an essentially tin-free catalyst formed by reacting noble metal ions with bromide ions where the noble metal is present in a concentration sufficient to catalyze an electroless plating reaction and a ratio of said bromide ions to said noble metal ions is at least 100 to 1; contacting a substrate to be plated with said catalyst; reducing said catalyst with a reducing agent and plating said substrate by contact of said reduced catalyst with an electroless metal plating solution.

2. The process of claim 1 where the noble metal is palladium.

3. The process of claim 2 where the concentration of palladium in the catalyst is at least 0.00005 moles per liter of solution.

4. The process of claim 3 where the concentration of palladium varies between 0.0001 and 0.25 moles per liter.

5. The process of claim 3 where the concentration of palladium varies between 0.0002 and 0.01 moles per liter.

6. The process of claim 2 where the ratio of bromide ions to palladium is at least 250 to 1.

7. The process of claim 6 where the ratio of bromide ions to palladium ions varies between 400 to 1 to 1,000 to 1.

8. The process of claim 2 where the reduction of the palladium is by contact with an electroless plating solution containing a reducing agent capable of reducing the palladium.

9. The process of claim 2 where the step of reduction precedes the step of electroless metal deposition.

10. The process of claim 2 where the step of reduction is by contact with a reducing agent selected from the group consisting of a borohydride and an amine borane.

11. The process of claim 10 where the reducing agent is an amine borane.

12. The process of claim 2 where the substrate has a coating of a bonding layer comprising a terminus group capable of bonding to the substrate and a second terminus group remote from the first capable of complexing with the catalyst.

13. The process of claim 12 where the bonding layer is an organosilane.

14. A tin-free electroless plating catalyst formed by reacting noble metal ions with bromide ions where the noble metal ions are present in a concentration sufficient to catalyze an electroless plating reaction and a ratio of noble metal ions to bromide ions is at least 100 to 1.

15. The process of claim 14 where the noble metal is palladium.

16. The process of claim 15 where the concentration of palladium in the catalyst is at least 0.00005 moles per liter of solution.

17. The process of claim 16 where the concentration of palladium varies between 0.0001 and 0.25 moles per liter.

18. The process of claim 16 where the concentration of palladium varies between 0.0002 and 0.01 moles per liter.

19. The process of claim 15 where the ratio of bromide ions to palladium is at least 250 to 1.

20. The process of claim 19 where the ratio of bromide ions to palladium ions varies between 400 to 1 to 1,000 to 1.

* * * * *